United States Patent [19]

Fleischer

[11] Patent Number: 4,529,888
[45] Date of Patent: Jul. 16, 1985

[54] HIGH VOLTAGE SOLID STATE RELAY

[75] Inventor: Kenneth H. Fleischer, Los Angeles, Calif.

[73] Assignee: International Rectifier Corporation, Los Angeles, Calif.

[21] Appl. No.: 417,467

[22] Filed: Sep. 13, 1982

[51] Int. Cl.³ .............................................. H03K 17/72
[52] U.S. Cl. .............................. 307/252 T; 307/252 B
[58] Field of Search .............. 307/252 T, 252 B, 305, 307/252 N, 252 Q

[56] References Cited

U.S. PATENT DOCUMENTS

| | | | |
|---|---|---|---|
| 3,588,598 | 6/1971 | Isaacs | 307/252 T |
| 3,793,581 | 2/1974 | Ortgies, Jr. | 307/252 T |
| 4,039,866 | 8/1977 | Komuro et al. | 307/252 T |
| 4,338,546 | 7/1982 | Ehret et al. | 307/252 B |

Primary Examiner—John Zazworsky
Attorney, Agent, or Firm—Ostrolenk, Faber, Gerb & Soffen

[57] ABSTRACT

A solid state relay capable of switching highly inductive loads at voltages of about 480 volts RMS employs anti-parallel connected thyristors in one embodiment. The thyristors are controlled by respective pilot thyristors which inject current into the gates of the main power thyristors when the main power thyristors are to become conductive. The pilot thyristors are driven from a low voltage circuit which is insulated from the high voltage power circuit. The anode-to-cathode circuit of each of the pilot thyristors is connected in series with the secondary winding of a transformer having a primary winding which carries the main power current. When either of the main thyristors becomes conductive, the appropriate secondary transformer winding induces a voltage in the corresponding pilot thyristor circuit which turns off the pilot thyristor. The circuit ensures turn-on of the main power thyristors even under very highly inductive loads. In a second embodiment, the main thyristors are replaced by a single triac.

3 Claims, 2 Drawing Figures

HIGH VOLTAGE SOLID STATE RELAY

BACKGROUND OF THE INVENTION

This invention relates to high voltage solid state relays and more specifically relates to a novel relay circuit employing power semiconductor devices such as a triac or anti-parallel connected thyristors in which turn-on of the power devices is ensured under any inductive load and in which the load voltage is applied only to the power devices and a few associated components thereof, but is not applied to the control components of the relay.

Solid state relay circuits are well known and a typical solid state relay is shown in U.S. Pat. No. 3,723,769 entitled "Solid State Relay Circuit with Optical Isolation and Zero-Cross Firing" in the name of Collins, assigned to the assignee of the present invention. The solid state relay shown in the above patent employs anti-parallel connected thyristors or a triac in the main load circuit. Thyristor or triac firing is obtained in response to the turn-on of a pilot thyristor connected to the main power thyristor gate circuits. The power for operating the control circuit and the pilot thyristor is derived from the output circuit. Thus, the control components including the pilot thyristor must have voltage withstand capability high enough at least to withstand the voltage of the output circuit.

For very high voltage circuits, relatively expensive control components are needed. By an extremely high voltage a-c circuit is meant a circuit in which the RMS voltage is as high as about 480 volts at 50-60 Hz. Relay applications dealing with voltage of about 480 volts RMS are frequently encountered in both the United States and abroad and sometimes produce a peak voltage of, for example, 1200 volts which must be withstood by the individual components. Moreover, when circuits of this type are used to control very highly inductive circuits, the relay may not turn on as desired, upon the firing of the pilot thyristor, or the relay may "half-wave", in which only one of two anti-parallel connected thyristors is turned on.

BRIEF DESCRIPTION OF THE PRESENT INVENTION

In accordance with the present invention, a novel solid state relay circuit is provided which can be used to control extremely high voltage a-c circuits and extremely inductive loads. The power output stage of the relay, which includes the main power thyristors or triac which must handle high voltage, is separated from the input voltage stage, which includes the pilot thyristors which are employed to fire the high voltage power thyristors or triac. Also, in order to ensure turn-on of the power devices, even under very highly inductive loads, and to prevent half-waving of anti-parallel connected power thyristors, a novel circuit is employed so that each pilot thyristor anode-to-cathode circuit is inductively coupled to the main power circuit and the pilot thyristors are reverse-biased to be turned off, only when the corresponding power thyristor or the triac conducts output current.

More specifically, in accordance with a first embodiment of the invention, the pilot thyristor for each of a pair of anti-parallel connected power thyristors is connected in series with the secondary winding of a circuit having its primary winding in the main power conduction circuit. The anode-to-cathode circuit of the pilot thyristor is further connected in the gate-to-cathode circuit of its respective power thyristor.

A capacitor which can be charged from a suitable input control circuit is connected in series with each pilot thyristor and is charged to provide forward conduction current for the pilot thyristor when the pilot thyristor is on. Each pilot thyristor is also connected to a gate bias, which can be derived from the power circuit, so that each pilot is capable of turning on if anode voltage is providing during the time its corresponding power thyristor can conduct forward current. The pilot thyristor then becomes conductive when an input voltage is applied to the aforementioned capacitor and the gate bias is in the proper direction. The capacitor will then discharge into the gate circuit of the corresponding power thyristor, thus permitting the power thyristor to become conductive.

Once the power thyristor begins to conduct, a voltage is induced across the secondary winding in series with the pilot thyristor which tends to turn off the pilot thyristor. If the main or power thyristor does not latch on and begins to turn off, the pilot thyristor will repeatedly inject gate current into the power thyristor until the power thyristor latches on.

Thus, in accordance with the invention, the pilot thyristors are energized from a circuit which is separate from the main power circuit and need not be sized to withstand full line voltage. Moreover, the turn-on procedure ensures turn-on of the power thyristors even though the load is extremely inductive.

In a second embodiment of the invention, a power triac can be used in place of the anti-parallel connected power thyristors described above.

DETAILED DESCRIPTION OF THE DRAWINGS

Figure 1:
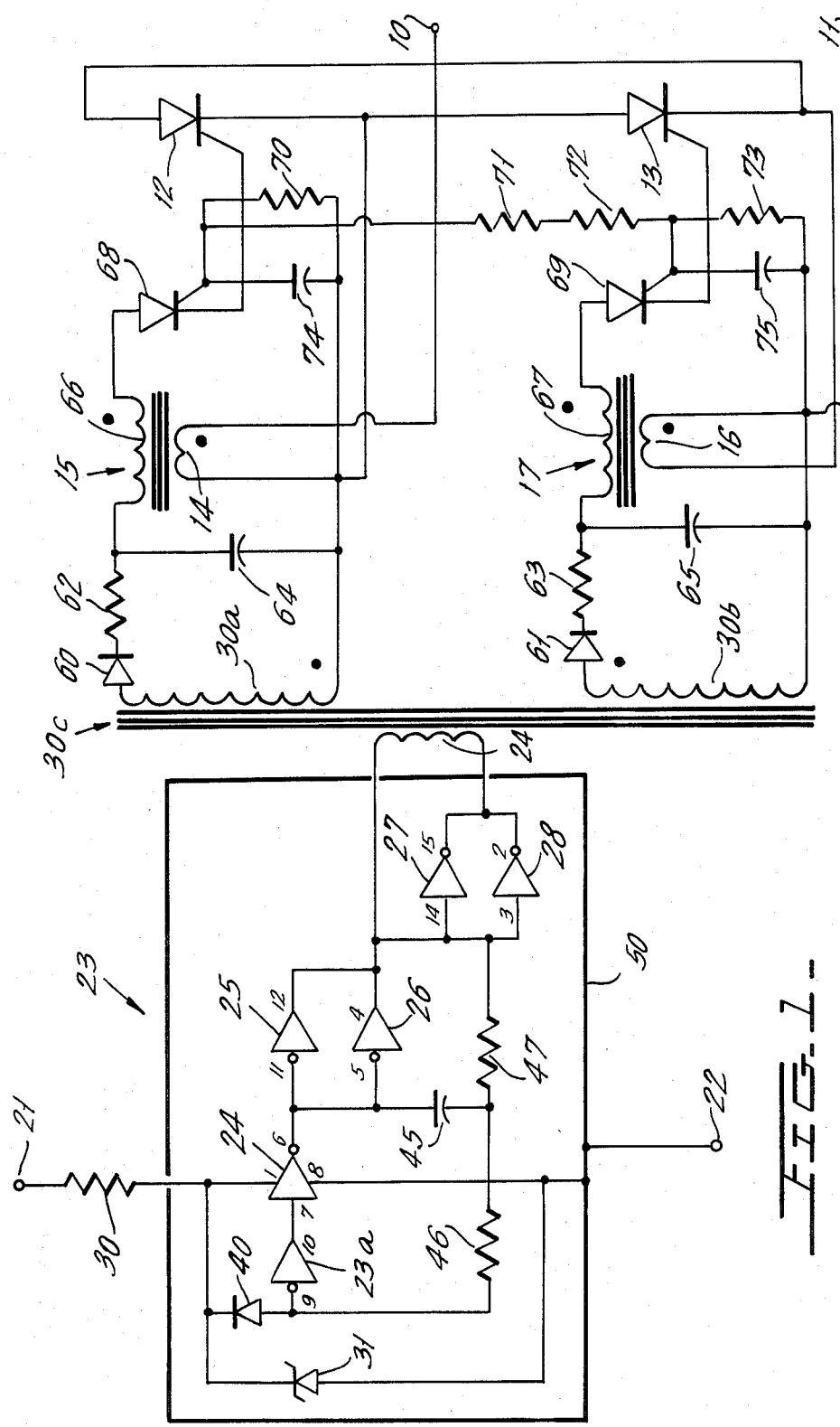
FIG. 1 shows a circuit diagram of the circuit of the present invention employing anti-parallel connected thyristors.

Referring first to FIG. 1, there is shown a solid state relay circuit employing the features of the present invention and intended for application in a power circuit having a rating, for example, of 480 volts at 50-60 Hz. with a current output which may be in excess of 40 amperes RMS. An inductive load can be connected to the relay output. The relay to be described hereinafter will meet VDE requirements because sufficient electrical isolation can be obtained between the output circuit connected to output terminals 10 and 11 and the input circuit components.

Main power thyristors 12 and 13 are connected anti-parallel relative to one another. Thyristors 12 and 13 are individually rated to withstand in excess of 1200 volts reverse and to conduct forward currents of 40 amperes RMS or higher, depending on the relay application.

Output terminal 10 is connected through the primary winding 14 of transformer 15 to the junction of the cathode of thyristor 12 and anode of thyristor 13. Similarly, output terminal 11 is connected through the primary winding 16 of transformer 17 to the junction of the cathode of thyristor 13 and the anode of thyristor 12. As will be later seen, the components 12 and 13 are exposed to the high voltage of the output terminals 10 and 11. All other components of the circuit will be relatively low voltage, low power devices. Although the primary windings 14 and 16 of transformers 15 and 17, respectively, are connected to the high voltage, the transformers need not be high voltage devices.

The input circuit for the relay includes d-c input terminals 21 and 22, which are positive and negative terminals respectively, and are adapted for connection to a source of d-c control voltage. Terminals 21 and 22 are connected to an oscillator 23 which produces a signal voltage for firing the power thyristors 12 and 13. The oscillator 23 may be identical to the oscillator disclosed in my co-pending application Ser. No. 361,184, filed Mar. 24, 1982, entitled "Solid State Relay Circuit Employing MOSFET Power Switching Devices" which is assigned to the assignee of the present invention. Any other desired type of oscillator or low voltage signal source can be employed in place of oscillator 23 of FIG. 1.

The oscillator 23 converts a signal input voltage between terminals 21 and 22 of between 3.5 and 20 volts d-c to a 100 kHz. square wave output voltage on primary winding 24. This high frequency square wave is rectified and employed as the source of control power for the pilot thyristors as will be later described.

The oscillator 23 as illustrated is a three gate oscillator and does not employ capacitive elements (other than for timing) which would slow down the turn-on or turn-off of the oscillator circuit. The oscillator shown will begin to oscillate when the input voltage between terminals 21 and 22 reaches about $2\frac{1}{2}$ volts d-c. Oscillator 23 employs a CMOS hex inverter which may be of the type CD4049UBE and includes the six inverter elements 23a, 24, 25, 26, 27 and 28 which have pins which are numbered as shown in FIG. 1.

The input to the oscillator 23 includes resistor 30 and zener diode 31, the series combination of which is connected across the terminals 21 and 22. Zener diode 31 clamps the input voltage to approximately 4.3 volts, thereby limiting the voltage which ultimately is produced on the secondary windings 30a and 30b of transformer 30c to less than about 9 volts.

A diode 40 is connected to resistor 30 and zener diode 31 as shown and serves the purpose of correcting the duty cycle of the oscillator 23 to approximately a 50% duty cycle. The anode of diode 40 is connected to the input of the inverter 23a and the output of inverter section 23a is connected to inverter section 24 which is, in turn, connected to the parallel-connected inverter sections 25 and 26. Sections 25 and 26 are connected in parallel to increase their power capability.

The output of inverter sections 25 and 26 is connected as shown to the input of inverter sections 27 and 28 and to one side of the primary winding 24. The outputs of inverter sections 27 and 28 are paralleled to increase their power cabability and are connected to the other side of primary winding 24. A conventional timing network consisting of capacitor 45 and resistors 46 and 47 controls the timing of the oscillator output. The oscillator circuit 23 is preferably enclosed by a suitable conventional conductive guard which is shown by heavy line 50.

Transformer 30c has a turns ratio between primary winding 24 to either of secondary winding 30a or 30b of 1:2. The operating frequency of transformer 30c is from 70 kHz to 130 kHz and isolation of the primary winding 24 to secondary windings 30a and 30b is preferably 5.3 kV. peak in order to meet VDE requirements. The isolation between the two secondary windings 30a and 30b is preferably at least 1200 volts peak. The primary inductance of the primary winding 24 may be about 10 millihenrys minimum.

Secondary windings 30a and 30b are connected in series with diodes 60 and 61, respectively, current limiting resistors 62 and 63, respectively, and capacitors 64 and 65, respectively. Both of diodes 60 and 61 are further connected in series with the secondary windings 66 and 67 of transformers 15 and 17, respectively, and are further in series with pilot thyristors 68 and 69, respectively.

The cathodes of thyristors 68 and 69 are connected to the gates of power thyristors 12 and 13, respectively. The gates of pilot thyristors 68 and 69 are connected to a resistive voltage divider consisting of resistors 70, 71, 72 and 73 connected across the output terminals 10 and 11. The junction between resistors 70 and 71 is connected to the gate of pilot thyristor 68, while the junction between resistors 72 and 73 is connected to the gate of pilot thyristor 69. Consequently, whenever the voltage between output terminals 10 and 11 is suitable, a sufficient gate signal is available for firing the appropriate pilot thyristor when a sufficient anode potential is produced by its respective capacitor 64 or 65.

Each of pilot thyristors 68 and 69 has respective capacitors 74 and 75 connected thereto, which act as delay components and serve as noise suppression circuits.

Transformers 15 and 17 have turns ratios of 1:4 to 1:6 between their primary and secondary windings. Preferably, the primary windings 14 and 16 are formed simply by a conductor which extends straight through a toridal ferrite core which has the winding 66 or 67 thereon. The secondary d-c resistance of windings 66 and 67 is preferably less than 1 ohm and the isolation between the secondary and primary windings of transformers 15 and 17 is a minimum of 30 volts. The primary inductance of primary windings 14 and 16 is a minimum of 7.2 microhenrys at 1 milliampere d-c.

The circuit of FIG. 1 operates in the following manner:

Assume that it is desired to turn on the relay and permit conduction through a load connected between terminals 10 and 11. Further presume that the load voltage is about 480 volts at 50–60 Hz. In order to turn the relay on, a control voltage is applied to the input terminals 21 and 22. A high frequency square wave voltage is then applied to primary winding 24 which produces a corresponding output on secondary windings 30a and 30b. The output voltage is then rectified in diodes 60 and 61 and capacitors 64 and 65 are charged through diodes 60 and 61, respectively. The capacitors 64 and 65, which act as energy storage devices, will charge to a voltage sufficient to produce a current to fire pilot thyristors 68 and 69, respectively, in less than about 0.10 millisecond. Assuming that the phase relationship between terminals 10 and 11 is such that terminal 10 is positive and terminal 11 is negative at the instant under consideration, the gate of thyristor 69 is positive so that the thyristor 69 is capable of conducting once a suitable anode-to-cathode voltage appears. Thus, once the capacitor 65 is sufficiently charged, the thyristor 69 fires and capacitor 65 discharges into the gate-to-cathode circuit of the power thyristor 13. The current through the pilot thyristor 69 upon firing will rise as required to fire output thyristor 13. This current will typically peak at about 80 milliamperes, as required by thyristor 13, but the circuit is capable of providing currents in excess of 200 milliamperes. The typical pulse duration is about 3 microseconds. Note that the pilot devices need be capable of blocking only 10 volts, and a 25-volt rating suffices.

The power thyristor 13 then begins to conduct power current. This will then cause current flow through the primary winding 16 of transformer 17 which induces a voltage across the secondary winding 67 which reverse-biases thyristor 69 to turn it off. If, however, the power thyristor 13 fails to latch on, as due to a very inductive load, the turn-on process described above immediately is reinitiated in order to again turn on the power thyristor 13. This procedure will continue very rapidly, for example, several times per microsecond, until the thyristor 13 ultimately latches on.

A similar operation causes turn-on of the parallel power thyristor 12 through the operator of the pilot thyristor 68 and its associated components when the voltage of terminals 10 and 11 reverses.

During the turn-on operation, and immediately after voltage is applied to the input terminals, capacitors 64 and 65 will initially be insufficiently charged to trigger its respective pilot thyristor to conduct sufficiently to trigger the corresponding output thyristor when the output is high enough to trigger the pilot device. However, the capacitor for the other of the pilot devices fully charges during this time and can deliver enough current to its pilot device to start normal operation.

It should be specifically noted that all of the main components described above except for the power thyristors 12 and 13 and transformer 30c are low voltage devices and that the pilot thyristors 68 and 69 are not exposed to the full voltage across the power thyristors 12 and 13. Moreover, the relay will be forced to turn on and will not halfwave even when the relay is connected to an extremely inductive load.

It should be further noted that the relay can be operated from an input of very low power because of the high efficiency of oscillator 23. Moreover, the relay has low noise because the high-energy pulses needed to fire thyristors 12 and 13 are derived from energy storage capacitors 64 and 65, rather than from the input terminals.

The novel circuit configuration of FIG. 1 was successfully implemented, using the following components:

| Resistors | |
|---|---|
| 30 | 620 ohms |
| 46 | 10 kilo ohms |
| 47 | 100 kilo ohms |
| 62 | 4.7 kilo ohms |
| 63 | 4.7 kilo ohms |
| 70 | 33 kilo ohms |
| 71 | 470 kilo ohms |
| 72 | 470 kilo ohms |
| 73 | 33 kilo ohms |
| Capacitors | |
| 45 | 50 picofarads |
| 64 | 0.02 microfarads |
| 65 | 0.02 microfarads |
| 74 | 5000 picofarads |
| 75 | 5000 picofarads |
| Semiconductor Devices | |
| Zener 31 | IN749A |
| Diode 40 | IN4148 |
| Diode 60 | IN4148 |
| Diode 61 | IN4148 |
| Thyristor 68 | 11609 |
| Thyristor 69 | 11609 |

In the above description of FIG. 1, the transformers 15 and 17 were shown as separate transformers. A single transformer with a single primary winding and two secondary windings 66 and 67 could be employed with the single primary in series with the output terminals 10 and 11.

Figure 2:
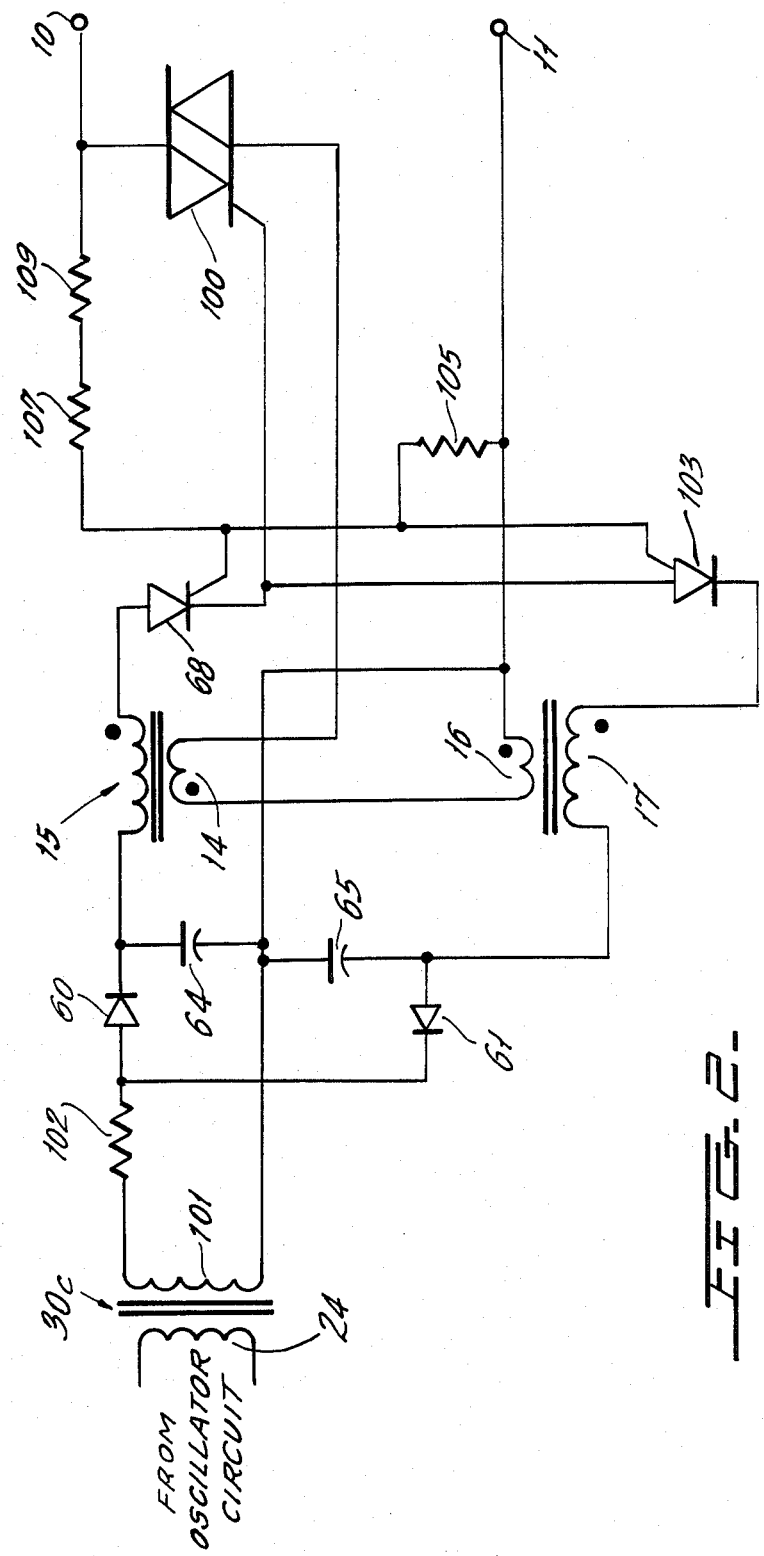
FIG. 2 shows a circuit diagram of the power handling portion of the circuit of the invention wherein a triac replaces the power thyristors of FIG. 1.

The present invention can employ any type of power thyristor means, such as a triac or thyristors. FIG. 2 shows a second embodiment of the invention in which the main power device or thyristor means consists of a triac 100 in place of the thyristors 12 and 13 of FIG. 1. FIG. 2 shows only the output stage for the relay. The same input circuit, including oscillator 23 of FIG. 1, can be used to drive transformer winding 24 of transformer 30c in FIG. 2. Note that, in FIG. 2, circuit components which are similar to those of FIG. 1 are given the same identifying numeral.

The circuit of FIG. 2 differs from that of FIG. 1 in several respects. First, transformer 30c has only a single secondary winding 101 in place of the two windings 30a and 30b of FIG. 1. A single 4.7 kilo ohm resistor 102 cooperates with diodes 60 and 61 and capacitors 64 and 65 which serve the same function they serve in FIG. 1. A second change, required by the use of triac 100 in place of thyristors 12 and 13, is in the connection of primary windings 14 and 16 in series with terminals 10 and 11 and triac 100. A third change is in the pilot devices which, in FIG. 2, consist of thyristor 68 and a complementary thyristor 103. Complementary thyristor 103 may be type C13Y sold by the General Electric Company, or any device complementary to thyristor 68.

The pilot thyristors 68 and 103 in FIG. 2 have gate circuits coupled to the junction between capacitors 64 and 65. A 33 kilo ohm resistor 105 is connected in the gate circuit of complementary thyristor 103 and two 470 kilo ohm resistors 107 and 109 are connected between the gates of thyristors 68 and 103 and the output terminal 10.

The gate of triac 100 is connected to the junction between devices 68 and 103. Thus, when either of these devices conducts, triac 100 turns on. As in the case of FIG. 1, power current through triac 100 will also flow in transformer windings 14 and 16 to ensure conduction of either of thyristors 68 or 103.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A high voltage solid state relay comprising, in combination: first and second power thyristors connected in anti-parallel relation to one another; a first output terminal connected to the anode and cathode of said first and second power thyristors, respectively, and a second output terminal connected to the cathode and anode of said first and second power thyristors, respectively; first and second pilot thyristors having respective anode-to-cathode circuits connected in series with the gate-to-cathode circuits of said first and second power thyristors, respectively; firing circuit means to fire said first and second pilot thyristors in order to render conductive said first and second power thyristors respectively; transformer means having primary winding means connected in series with said first and second power thyristors and in series with said first and second output terminals; and first and second secondary windings coupled to said primary winding means; said first and second secondary windings connected in series with said first and second pilot thyristors respectively; said first and second secondary windings being connected to induce a reverse-biasing voltage across the anode-to-cathode circuit of its respective pilot thyristor in response to conduction of power current through said primary winding means and a respective one of said first or second power thyristors.

2. The relay of claim 1, wherein said primary winding means includes first and second primary windings for said first and second secondary windings respectively.

3. A high voltage solid state relay comprising, in combination: first and second power thyristors connected in anti-parallel relation to one another; a first output terminal connected to the anode and cathode of said first and second power thyristors, respectively, and a second output terminal connected to the cathode and anode of said first and second power thyristors, respectively; first and second pilot thyristors having respective anode-to-cathode circuits connected in series with the gate-to-cathode circuits of said first and second power thyristors, respectively, first and second power supply capacitors connected in series with said anode-to-cathode circuits of said first and second pilot thyristors respectively; low power control voltage input means operable to charge said first and second capacitors at a given time; first transformer means interposed between said control voltage input means and said first and second capacitors whereby said input means are protected from very high voltages that may develop in said relay; gate bias means connected to the gates of said first and second pilot thyristors for biasing a respective one of said first and second pilot thyristors to a firing condition when its corresponding power thyristor is forward-biased; said first or second power thyristor becoming conductive in response to the firing of its said respective pilot thyristor; said first or second pilot thyristor firing due to the application of power to the anode-to-cathode circuit of said last-mentioned respective pilot thyristor while said gate bias means is applied thereto; second transformer means having a primary winding means connected in series with said first and second power thyristors and in series with said first and second output terminals; and first and second secondary windings coupled to said primary winding means and connected in series with said first and second pilot thyristors respectively; said secondary windings being connected to induce a reverse biasing voltage across the anode-to-cathode circuit of its respective pilot thyristor in response to conduction of power current through said primary winding means and a respective one of said first or second power thyristors wherein said primary winding means includes first and second primary windings for said first and second secondary windings respectively.

* * * * *